US006727430B1

(12) United States Patent
Franks, Jr.

(10) Patent No.: US 6,727,430 B1
(45) Date of Patent: Apr. 27, 2004

(54) METHODS AND APPARATUS TO SECURE A GROUND STRAP ASSEMBLY TO AN ELECTRICALLY CONDUCTIVE MEMBER

(75) Inventor: George J. Franks, Jr., Inverness, IL (US)

(73) Assignee: Senior Industries, Inc., Wood Dale, IL (US)

(*) Notice: Subject to any disclaimer, the term of this patent is extended or adjusted under 35 U.S.C. 154(b) by 0 days.

(21) Appl. No.: 10/365,293

(22) Filed: Feb. 12, 2003

(51) Int. Cl.$^{7}$ .................................................. H05K 5/02

(52) U.S. Cl. .................... 174/51; 174/40 CC; 174/135; 174/6; 439/98; 361/799

(58) Field of Search ................................ 174/51, 35 C, 174/135, 35 R, 40 CC, 6, 78, 84 C; 439/98, 100; 361/799, 800, 753

(56) References Cited

U.S. PATENT DOCUMENTS

| | | | | |
|---|---|---|---|---|
| 807,497 | A | 12/1905 | Reeve | |
| 846,400 | A | 3/1907 | Cox | |
| 907,542 | A | 12/1908 | Vogel | |
| 972,489 | A | 10/1910 | Adams | |
| 1,250,467 | A | 12/1917 | Johnson | |
| 1,418,650 | A | 6/1922 | Johnson | |
| 1,505,314 | A | 8/1924 | Cox | |
| 1,552,932 | A | 9/1925 | Kessler | |
| 1,675,163 | A | 6/1928 | Colburn | |
| 1,839,254 | A | 1/1932 | Pearson et al. | |
| 2,061,463 | A | 11/1936 | Hall | 248/73 |
| 2,114,752 | A | 4/1938 | Tallman | 173/273 |
| 2,423,627 | A | 7/1947 | Tinnerman | 173/273 |
| 2,532,068 | A | 11/1950 | Larsen | |
| 2,681,196 | A | 6/1954 | Lind | 248/71 |
| D233,733 | S | 11/1974 | Byerly | D8/235 |
| 4,026,619 | A | 5/1977 | Gillemot | |
| 4,103,986 | A | 8/1978 | Izraeli | |
| D269,155 | S | 5/1983 | Rose | D8/356 |
| 4,591,229 | A | 5/1986 | Sachs | 339/251 |
| 4,623,204 | A | 11/1986 | Auclair | 339/14 L |
| 4,626,051 | A | 12/1986 | Franks, Jr. | 339/14 R |
| 4,664,469 | A | 5/1987 | Sachs | 339/251 |
| 4,780,096 | A | 10/1988 | Franks, Jr. | 439/813 |
| D301,303 | S | 5/1989 | Hoover | D8/356 |
| 4,828,504 | A | 5/1989 | Franks, Jr. | 439/92 |
| 4,925,395 | A | 5/1990 | Franks, Jr. | 439/100 |
| 4,944,683 | A | 7/1990 | Leonardo | 439/96 |
| D313,392 | S | 1/1991 | Sachs | D13/133 |

(List continued on next page.)

FOREIGN PATENT DOCUMENTS

| | | |
|---|---|---|
| CH | 150427 | 10/1931 |
| DE | 373689 | 9/1935 |

OTHER PUBLICATIONS

Allied Bolt Drop Wire Hardwire, Product Catalog, p. 37, No Date.

3 photos of electric motion ground strap UL FM 5510 DB No Date.

3 photos of Sachs ground strap (UL listed 99N9) No Date.

1 photo of diamond ground strap listed 3C36 No Date.

3 photos of Allied Bolt ground clamp corresponding to U.S. Patent No. 6,398,596.

*Primary Examiner*—Dhiru R Patel
(74) *Attorney, Agent, or Firm*—Fitch, Even, Tabin & Flannery

(57) ABSTRACT

Methods and apparatus to secure a ground strap assembly to an electrically conductive member are disclosed. In a disclosed example, a ground strap assembly includes a bendable ground strap, and a grounding clip having at least one flange located to substantially prevent rotation of the clip relative to the bendable strap. The example ground strap assembly also includes a fastener securing the grounding clip to the bendable strap. It is not necessary to remove the fastener from the bendable ground strap to secure the ground strap assembly to an electrically conductive member.

36 Claims, 4 Drawing Sheets

U.S. PATENT DOCUMENTS

| | | | | | |
|---|---|---|---|---|---|
| 4,993,960 | A | | 2/1991 | Franks, Jr. | 439/92 |
| 5,006,074 | A | | 4/1991 | Franks, Jr. | 439/92 |
| 5,131,856 | A | * | 7/1992 | Auclair | 439/100 |
| D331,358 | S | | 12/1992 | Sachs | D8/356 |
| D342,013 | S | | 12/1993 | Sachs | D8/356 |
| 5,314,343 | A | | 5/1994 | Englander | 439/100 |
| 5,616,036 | A | | 4/1997 | Polidori | |
| D398,218 | S | | 9/1998 | Coll et al. | D8/356 |
| 6,011,218 | A | * | 1/2000 | Burek et al. | 174/40 CC |
| 6,398,596 | B1 | * | 6/2002 | Malin | 439/800 |

* cited by examiner

Fig. 1
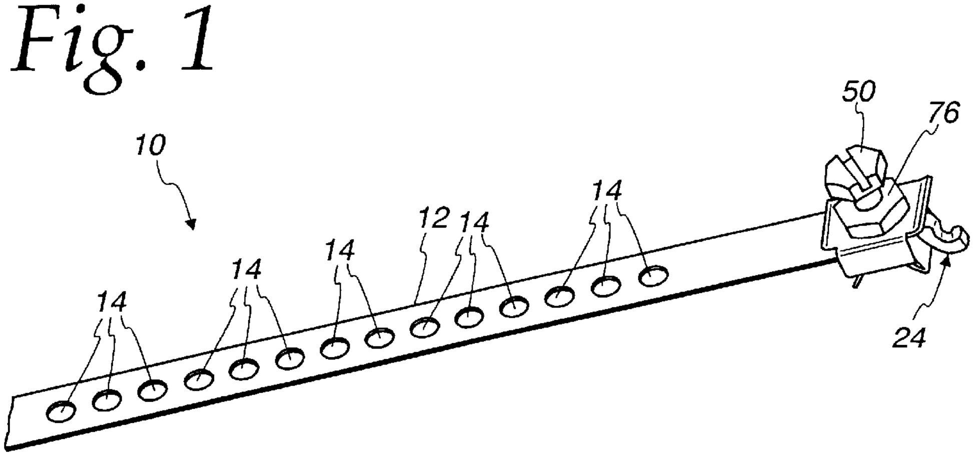
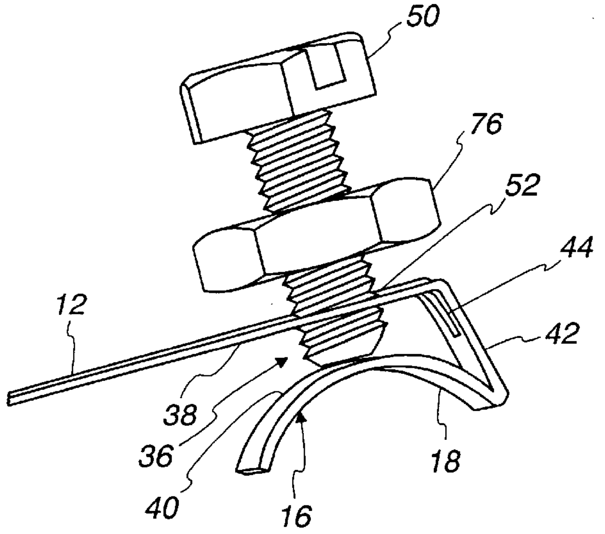
Fig. 2
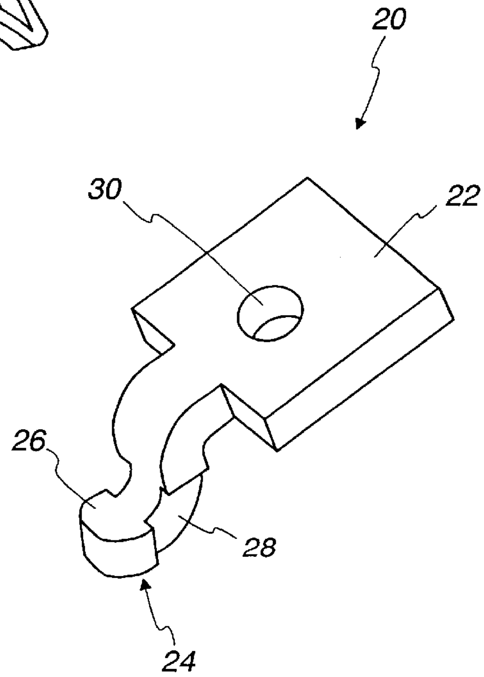
Fig. 3

METHODS AND APPARATUS TO SECURE A GROUND STRAP ASSEMBLY TO AN ELECTRICALLY CONDUCTIVE MEMBER

FIELD OF THE DISCLOSURE

This disclosure relates generally to electrical grounding, and, more particularly, to methods and apparatus to secure a ground strap assembly to an electrically conductive member.

BACKGROUND

It is known to use prior art ground strap assemblies to secure a ground wire to an electrically conductive member such as a plumbing pipe, a mast, etc. Such prior art strap assemblies typically include a bendable ground strap defining a plurality of bores, a fastener that can be passed through two of the bores in the bendable ground strap and secured thereto via a threaded member, and a ground nut which secures a ground wire in electrically conductive contact with the bendable strap. To secure the prior art ground strap assemblies to an electrically conductive member, the fastener and ground nut are typically removed, and the bendable ground strap is wrapped around the electrically conductive member such that it overlays itself in the location where the fastener is to secure the ground nut and the ground wire to the bendable ground strap. Specifically, two of the bores defined in the bendable strap are brought into registration and the fastener is then passed through the aligned bores and threaded into the threaded member. Thus, prior art ground strap assemblies typically require removal of a fastener from a bendable strap and, after the bendable strap is generally positioned in its intended environment of use, re-insertion of the fastener into the bendable ground strap.

Prior art ground straps also include a projection or hook that mates with a bore defined in the strap to assist the fastener in securing the strip to the electrically conductive member.

The ground nuts of prior art grounding straps are typically implemented by conventional hex nuts. It is, thus, usually necessary to rotate the hex nut relative to the fastener to couple a ground wire to a prior art grounding strap. Such rotation of the hex nut occurs after the grounding wire is positioned beneath the hex nut. As a result, the installer must exert effort to ensure the ground wire does not separate from between the hex nut and the bendable ground strap when the hex nut is being tightened.

BRIEF DESCRIPTION OF THE DRAWINGS

FIG. 1 is a perspective view of an example ground strap assembly.

FIG. 2 is an enlarged side, perspective view of an end of the strap assembly of FIG. 1, but showing the end of the strap assembly from the side with the grounding clip and the threaded member removed.

FIG. 3 is a perspective view of the threaded member of FIG. 1.

DETAILED DESCRIPTION

Figure 4:
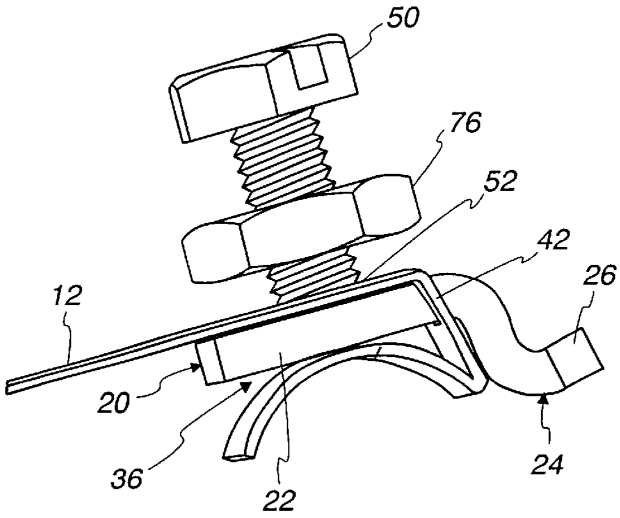
FIG. 4 is a view similar to FIG. 2, but including the threaded member.

FIG. 1 is a perspective view of an example grounding strap assembly 10. The grounding strap assembly 10 is adapted to secure a ground wire 11 (see FIG. 10) to an electrically conductive structure 13 (see FIGS. 9 and 10) such as a plumbing pipe, a mast, etc. To this end, the grounding strap assembly 10 is provided with a bendable ground strap 12. The bendable strap 12 may be implemented by a thin strip of copper or other conductive metal. In the example of FIG. 1, the ground strap 12 is approximately one-half inch wide and several inches long, but persons of ordinary skill in the art will readily appreciate that straps of other dimensions would likewise be appropriate.

As shown in FIG. 1, the bendable ground strap 12 is penetrated by a series of hook apertures bores 14. The hook apertures 14 are stamped into the strap 12 along a line beginning near a first end of the strap. In the illustrated example, the hook apertures 14 are evenly spaced from one another and are centered on the longitudinal center axis of the ground strap 12.

Figure 9:
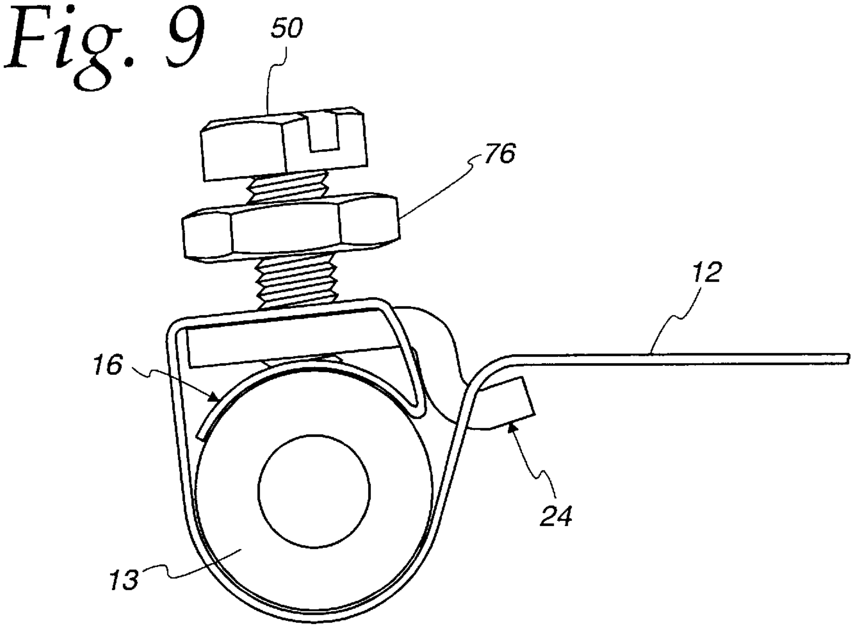
FIG. 9 is a side view of the ground strap assembly of FIG. 1 mounted on an electrically conductive member shown with the grounding clip removed.
Figure 10:
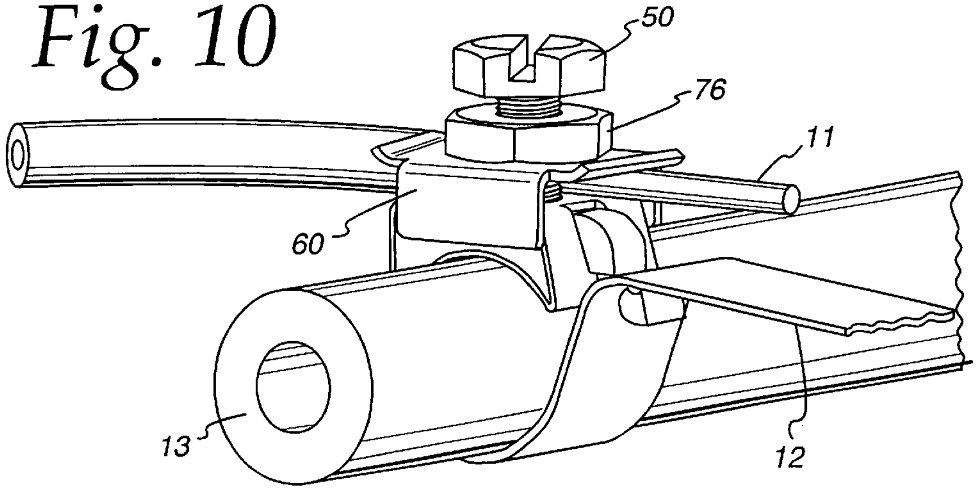
FIG. 10 is a perspective view of the ground strap of FIG. 1 mounted on an electrically conductive member and showing an attached ground wire.

For the purpose of engaging an electrically conductive structure 13, the second end of the bendable ground strap 12 is formed into an arc 16 as shown in FIG. 2. The bottom surface 18 of the arc 16 is intended to mate with an outer circumference of a cylindrical electrically conductive member 13 in a conventional fashion as shown in FIGS. 9 and 10.

To secure the bendable ground strap 12 around an electrically conductive member 13, the ground strap 12 is further provided with a threaded member 20. As shown in FIG. 3, the threaded member 20 of the illustrated example includes a rectilinear body 22 and a hook 24 which extends downwardly and outwardly from the body 22. The body 22 is, thus, located in a first plane and the hook 24 includes a point or head 26 which is located in a second plane below the first plane. The point 26 of the illustrated hook 24 is joined to the body 22 by an S-shaped shank 28. As shown in FIG. 3, in the illustrated example the point 26 has a greater width than the shank 28.

As shown in FIG. 3, the body 22 of the threaded member 20 defines a threaded bore 30. The threaded bore 30 is dimensioned to mate with a fastener 50 as discussed below, and is located in the approximate center of the body 22. The threaded bore 30 penetrates the entire depth of the body 22 to permit the fastener 50 to pass through the body 22. The threaded member 20 may be implemented from any desired material, but in the illustrated example, it is made of galvanized steel.

In the example illustrated in FIG. 2, the second end of the strap 12 is bent downward and backward to define a capture space 36 above the arc 16. More specifically, the capture space 36 is bounded on three sides by an undersurface portion 38 of the strap 12, an upper surface 40 of the arc 16, and a joining segment 42 of the strap 12 coupling the undersurface portion 38 and the arc 16.

To permit location of the threaded member 20 in the capture space 36, the joining segment 42 defines a bore 44.

The bore 44 is positioned to receive the hook 24 of the threaded member 20 such that the hook 24 extends through the joining segment 42 of the strap 12. Thus, as most easily seen in FIG. 4, when the threaded member 20 is positioned in the capture space 36, the body 22 and bore 30 of the threaded member 20 are located on one side of the joining segment 42 of the strap 12 and the head 26 of the hook 24 is located on an opposite side of the joining segment 42.

Figure 7:
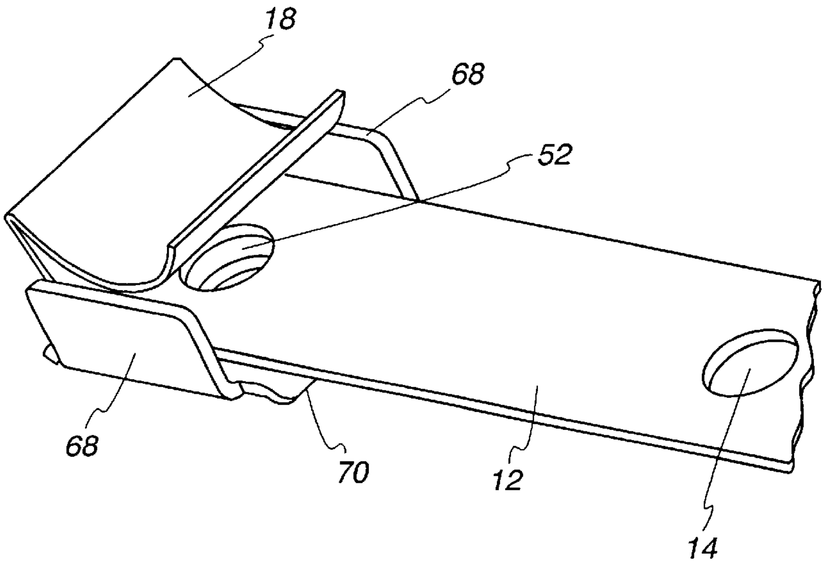
FIG. 7 is a bottom perspective view of the strap assembly of FIG. 1, but excluding the threaded member, the fastener and the ground nut.

For the purpose of securing the threaded member 20 within the capture space 36, the ground strap assembly 10 is further provided with a fastener 50. As shown in FIGS. 3 and 4, the fastener 50 passes through a bore 52 defined in the bendable strap 12 (see FIG. 7) and threads into the threaded bore 30 of the threaded member 20. The fastener 50 may be threaded completely through the threaded bore 30 and into engagement with the upper surface 40 of the arc 16 as shown in FIG. 2. The fastener 50 may be implemented by any conventional fastener, but in the illustrate example it is implemented by a brass screw having a slotted hexagonal head.

Figure 5:
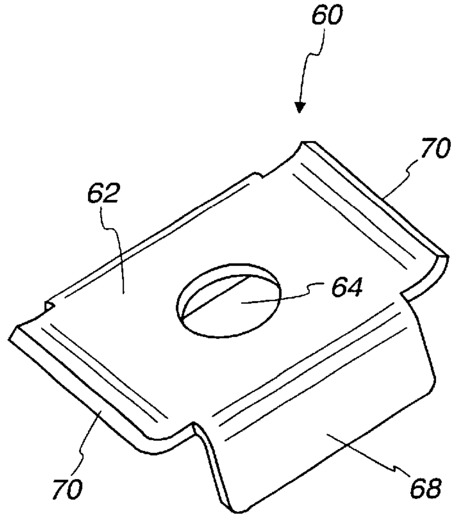
FIG. 5 is a top perspective view of an example grounding clip.
Figure 6:
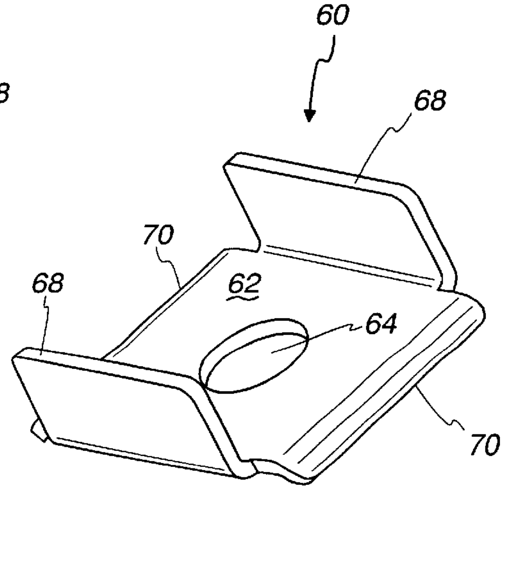
FIG. 6 is a bottom perspective view of the grounding clip of FIG. 5.

In order to connect a ground wire 11 to the bendable strap 12, the grounding strap assembly 10 is further provided with a grounding clip 60. As shown in FIGS. 5 and 6, the illustrated grounding clip includes a generally planar body 62. The body 62 defines a bore 64 for receiving the fastener 50 as explained in further detail below.

To substantially prevent rotation of the grounding clip 60 relative to the bendable strap 12, the grounding clip 60 is further provided with flanges 68 which extend downwardly from the body 62. As most easily seen in FIGS. 6 and 7, the flanges 68 are spaced apart to receive the bendable strap 12 therebetween. When the bendable strap 12 is positioned between the flanges 68, each of the flanges 68 is immediately adjacent an opposite side of the strap 12. Engagement of a flange 68 and a side surface of the strap 12 substantially prevents the grounding clip 60 from rotating relative to the strap 12 about the central axis of the bore 64 (i.e., an axis which is substantially perpendicular to the body 62).

To facilitate insertion of a ground wire 11 (see FIG. 10) beneath the body 62 of the grounding clip 60, the grounding clip 60 is further provided with upwardly oriented flanges 70. As most easily seen in FIG. 5, a first upwardly oriented flange 70 is located at a first end of the body 62 and a second upwardly oriented flange is located at a second end opposite the first end of the body 62. Thus, the body 62 joins the upwardly oriented flanges 70 and the downwardly oriented flanges 68 into a unitary structure. Persons of ordinary skill in the art will appreciate that although the illustrated example includes two upwardly oriented flanges 70, a different number of such flanges 70 (including, for example, zero, one, three, etc.) may alternatively be employed. Two, oppositely disposed flanges 70, are currently preferred, however, to facilitate insertion of the ground wire from either side of the grounding clip 60. Making the grounding clip 60 symmetrical with respect to the upwardly oriented flanges 70 and the downwardly oriented flanges 68 is also preferred because it simplifies the assembly of the clip 60 to the strap 12 in that the clip 60 may be oriented in either direction without any difference in functionality or appearance.

Figure 8:
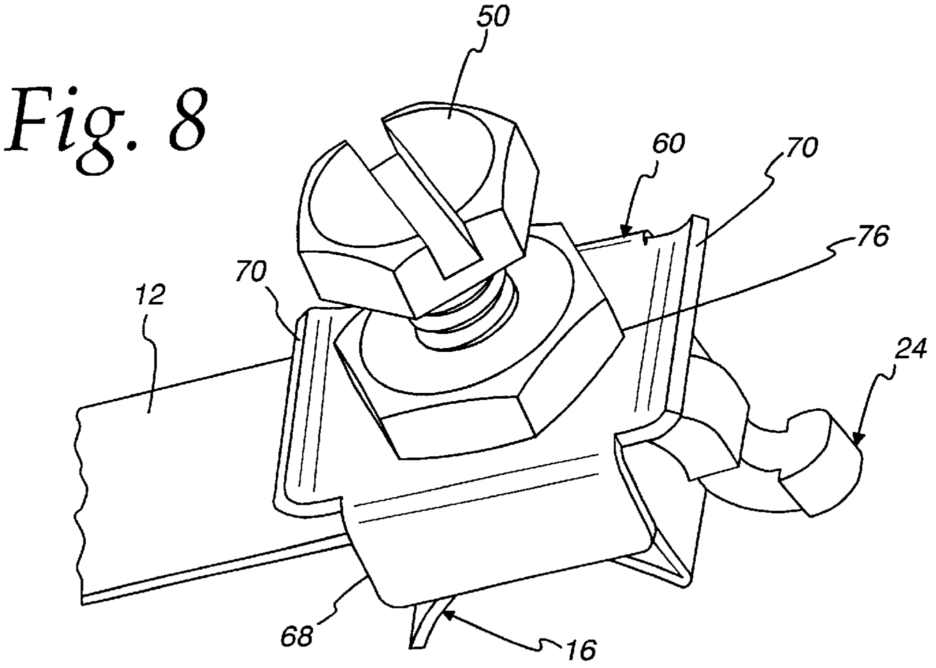
FIG. 8 is an enlarged side, perspective view of an end of the strap assembly of FIG. 1

As shown in FIG. 8, the grounding clip 60 is mounted to the bendable strap 12 by passing the fastener 50 through the bore 64 of the grounding clip 60, the bore 52 of the strap 12, and the threaded bore 30 of the threaded member 20. Thus, the grounding clip 60 is located adjacent a top surface of the bendable strap 12 and the threaded member 20 is located adjacent a bottom surface of the bendable strap 12. When so assembled, the downwardly extending flanges 68 of the grounding clip 60 are located on opposite sides of the bendable ground strap 12, one of the upwardly oriented flanges 70 is located above the strap 12, and the oppositely located, upwardly oriented flange 70 is located above the hook 24. Thus, a ground wire 11 can be easily slid under the upwardly oriented flange 70 and between the grounding clip 60 and the bendable ground strap 12 as shown in FIG. 10.

A ground nut 76 carried by the fastener 50 may then be tightened down to securely clamp the ground wire 11 between the grounding clip 60 and the bendable strap 12. As shown in FIG. 8, the ground nut 76, (which may be implemented by any known nut such as a brass hexagonal nut), is located adjacent the top of the body 62 of the grounding clip 60. Thus, when the ground nut 76 is tightened, it applies a force driving the body 62 of the grounding clip 60 downward toward the upper surface of the bendable strap 12. As a result, the undersurface of the body 62 presses against the ground wire 11 to trap that wire in electrical contact with the electrically conductive, bendable strap 12. The downwardly oriented flanges 68 of the grounding clip 60 ensure that the ground wire does not escape from between the clip 60 and the strap 12 during this tightening process.

FIG. 9 illustrates the grounding strap assembly 10 mounted to an example electrically conductive member 13. As shown in FIG. 9, the bendable strap 12 is wrapped around the electrically conductive member 13 with the arc 16 in electrically conductive engagement with an outer surface of the electrically conductive member 13. When so positioned, one of the hook apertures 14 receives the point 26 of the hook 24. With the hook 24 threaded through an aperture 14, the fastener 50 is tightened. Tightening the fastener 50 with the end of the fastener 50 engaging the upper surface of the arc 16 causes the undersurface portion 38 of the strap 12 to move away from the arc 16 thereby causing the strap 12 to tighten onto the electrically conductive member 13. The hook aperture 14 that receives the hook 24 may move slightly with respect to the point 26 of the hook 24 during this tightening process as permitted by the reduced width of the shank 28 of the hook 24 to thereby ensure that the strap 12 cannot separate from the hook 24.

Significantly, as shown in FIG. 9, because of the S-shaped shank 28 of the hook 24, the grounding strap assembly 10 may be secured to the hook 24 without wrapping the strap 12 over the grounding clip 60, and without removing the fastener 50 from the threaded member 20. In other words, the fastener 50 only passes through the strap 12 one time when the strap assembly 10 is secured to the electrically conductive grounding member 13. Thus, unlike prior art grounding straps, the example grounding strap assembly 10 illustrated herein may be secured to an electrically conductive structure 13 without ever removing the fastener 50 from the strap assembly 10 thereby eliminating an installation step and saving users of the strap assembly 10 the labor time associated with that eliminated step. Persons of ordinary skill in the art will appreciate that, since the fastener 50 need not be removed to install the grounding strap assembly 10, the potential to drop and/or lose the fastener 50 and/or the grounding nut 76 associated with installing prior art grounding straps is not present in the example strap assembly 10 illustrated herein.

The illustrated ground strap assembly 10 eliminates the need for overlapping and passing a fastener through the overlapped strap as present in prior art straps, because the shank 28 of the hook 24 extends downward a distance. This downward extension permits the end of the hook 24 to be upwardly inclined at a relatively steep slope. The steep slope of the end of the hook 24 ensures that the strap 12 remains on the hook 24 during tightening. The security of the attachment of the strap 12 and the hook 24 is further enhanced by the presence of the reduced shank segment adjacent the point 26 of the hook 24. In particular, once the strap 12 begins to tighten, the hole receiving the point 26 of the hook 24 moves off-center with respect to the hook 26 to thereby substantially prevent the hole from sliding back off of the hook 26.

The downward extension of the shank 28 is also advantageous in that it ensures that the free end of the strap 12 does not interfere with insertion of a ground wire 11 beneath the grounding clip 60. Thus, in the illustrated assembly 10, a ground wire 11 can be inserted between the strap 12 and the grounding clip 60 from either of two opposite ends.

The illustrated grounding strap assembly 10 may be secured to an electrically conductive member 13 in the following manner. First, the grounding clip 60 is fastened to the ground strap 12 with the fastener 50. This fastening may be performed by the manufacturer such that the installer may not need to handle the assembly 10 with the fastener 50 removed.

The installer then engages the electrically conductive structure 13 with an engaging surface of the ground strap 12 such as the arc 16. The installer then wraps the ground strap 12 around the electrically conductive structure 13 and connects the ground strap 12 to the hook 24 extending from the ground strap 12. The fastener is tightened to secure the ground strap 12 to the hook 24. A ground wire is inserted between the grounding clip 60 and the ground strap 12, and the nut 76 is tightened to secure the ground wire beneath the grounding clip 60 in electrically conductive engagement with the ground strap 12.

Although the illustrated strap assembly 10 does not require removal of the fastener 50 and/or overlap of the bendable strap 12 at the location of the bore 52 to mount the strap assembly 10 to an electrically conductive member, persons of ordinary skill in the art will appreciate that the illustrated example could be modified for use in the overlapping style, if desired. For example, the grounding clip 60 could be used with an overlapping strap with the grounding clip 60 being mounted adjacent the overlapping sections of the strap if such overlapping is desired.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents.

What is claimed is:

1. For use in connecting a grounding wire to an electrically conductive structure, a ground strap assembly comprising:

a bendable strap;

a grounding clip having at least one flange located to substantially prevent rotation of the clip relative to the bendable strap; and a fastener removably securing the grounding clip to the bendable strap such that the grounding wire can be captured between the grounding clip and the bendable strap.

2. A ground strap assembly as defined in claim 1 wherein the at least one flange is positioned adjacent a side surface of the bendable strap.

3. A ground strap assembly as defined in claim 1 wherein the at least one flange comprises a first flange and a second flange, the first and second flanges being downwardly oriented and located on opposite sides of the bendable strap.

4. A ground strap assembly as defined in claim 1 wherein the grounding clip includes a first upwardly oriented flange located to facilitate insertion of the grounding wire between the grounding clip and the bendable strap from a first end of the grounding clip and a second upwardly oriented flange located to facilitate insertion of the grounding wire between the grounding clip and the bendable strap from a second end opposite the first end of the grounding clip.

5. A ground strap assembly as defined in claim 1 wherein the grounding clip includes an upwardly oriented flange located to facilitate insertion of the grounding wire between the grounding clip and the bendable strap.

6. A ground strap assembly as defined in claim 5 wherein the grounding clip further comprises a body joining the at least one flange and the upwardly oriented flange.

7. A ground strap assembly as defined in claim 6 wherein the body is positioned to secure the grounding wire to the bendable strap when the grounding clip is secured to the bendable strap.

8. A ground strap assembly as defined in claim 7 wherein the body defines a bore for receiving the fastener.

9. A ground strap assembly as defined in claim 1 further comprising a threaded member disposed adjacent a first surface of the bendable strap, the grounding clip being disposed adjacent a second surface of the bendable strap opposite the first surface of the bendable strap.

10. A ground strap assembly as defined in claim 9 wherein the threaded member defines a threaded bore for receiving the fastener, the grounding clip defines a second bore for receiving the fastener, and the bendable strap defines a third bore for receiving the fastener, and wherein the fastener is positioned within the threaded bore, the second bore and the third bore.

11. A ground strap assembly as defined in claim 10 wherein the bendable strap includes an end which is bent to capture the threaded member between the first surface of the bendable strap and an upper surface of the end.

12. A ground strap assembly as defined in claim 11 wherein the end of the bendable strap includes an undersurface that is formed to mate with the electrically conductive structure.

13. A ground strap assembly as defined in claim 11 wherein the fastener engages the upper surface of the end of the bendable strap when the fastener is positioned within the threaded bore, the second bore and the third bore.

14. A ground strap assembly as defined in claim 11 wherein the threaded member includes a hook and the end of the bendable strap includes a fourth bore positioned to receive the hook such that the hook extends through the bendable strap with the threaded bore on one side of the bendable strap and the hook on an opposite side of the bendable strap.

15. A ground strap assembly as defined in claim 14 wherein the bendable strap defines a hook aperture positioned to receive the hook when the bendable strap is wrapped around the electrically conductive structure.

16. A ground strap assembly as defined in claim 15 wherein the bendable strap is secured to the electrically conductive structure without wrapping the bendable strap over the grounding clip.

17. A ground strap assembly as defined in claim 15 wherein the fastener is secured to the threaded member before the bendable strap is secured to the electrically conductive structure, and the bendable strap is secured to the electrically conductive structure without removing the fastener from the threaded member.

18. A ground strap assembly as defined in claim 14 wherein the hook includes a tip and a reduced width segment adjacent the tip.

19. A ground strap assembly as defined in claim 14 wherein the threaded member includes a body, the body includes the threaded bore, and the hook extends downwardly and outwardly from the body of the threaded member.

20. A ground strap assembly as defined in claim 19 wherein the body of the threaded member is positioned in a first plane and the hook includes a point positioned in a second place below the first plane.

21. A ground strap assembly as defined in claim 20 wherein the point of the hook is coupled to the body of the threaded member by a shank, and the point of the hook has a greater width than the shank.

22. A ground strap assembly as defined in claim 1 further comprising a ground nut secured to the bendable strap via the fastener, the grounding clip being positioned between the ground nut and the bendable strap.

23. A ground strap assembly as defined in claim 1 wherein the fastener passes through the bendable strap only one time when the bendable strap is secured to the electrically conductive member.

24. For use in connecting a grounding wire to an electrically conductive structure with a ground strap, a grounding clip comprising:

a body;

a flange extending downwardly from the body and located to substantially prevent rotation of the clip relative to the ground strap about an axis perpendicular to the body; and an upwardly oriented flange located to facilitate insertion of a ground wire between the grounding clip and the ground strap.

25. A grounding clip as defined in claim 24 wherein the downwardly extending flange is positioned adjacent a side surface of the ground strap.

26. A grounding clip as defined in claim 24 wherein the downwardly extending flange comprises a first flange and a second flange, the first and second flanges being spaced apart to receive the ground strap therebetween.

27. A grounding clip as defined in claim 24 further comprising a first upwardly oriented flange located to facilitate insertion of a ground wire between the grounding clip and the ground strap from a first end of the grounding clip and a second upwardly oriented flange located to facilitate insertion of the ground wire between the grounding clip and the ground strap from a second end opposite the first end of the grounding clip.

28. A grounding clip as defined in claim 24 wherein the body joins the at least one flange and the upwardly oriented flange.

29. A grounding clip as defined in claim 24 wherein the body is positioned to secure the ground wire to the ground strap when the grounding clip is secured to the ground strap.

30. A grounding clip as defined in claim 29 wherein the body defines a bore for receiving a fastener.

31. A method of securing a ground strap to an electrically conductive structure comprising:

fastening a grounding clip to the ground strap with a fastener, the grounding clip having a flange positioned to prevent rotation of the grounding clip relative to the ground strap in at least one direction;

engaging the electrically conductive structure with an engaging surface of the ground strap;

wrapping the ground strap around the electrically conductive structure;

connecting the ground strap to a hook extending from the ground strap;

inserting a ground wire between the grounding clip and the ground strap; and tightening the fastener to secure the ground strap to the hook.

32. A method as defined in claim 31 wherein the flange comprises a first flange and a second flange, the first and second flanges being located adjacent opposite sides of the ground strap.

33. A method as defined in claim 31 further comprising tightening a nut to secure the ground wire between the grounding clip and the ground strap.

34. A method as defined in claim 31 wherein the grounding clip includes an upwardly oriented flange to facilitate inserting the ground wire between the grounding clip and the ground strap.

35. A method as defined in claim 31 wherein fastening the grounding clip to the ground strap with the fastener occurs before wrapping the ground strap around the electrically conductive structure.

36. A method as defined in claim 31 wherein the fastener passes through the ground strap only one time when the ground strap is secured to the electrically conductive member.

* * * * *